(12) United States Patent
Frougier et al.

(10) Patent No.: US 12,112,782 B2
(45) Date of Patent: Oct. 8, 2024

(54) COMPACT MRAM ARCHITECTURE WITH MAGNETIC BOTTOM ELECTRODE

(71) Applicant: International Business Machines Corporation, Armonk, NY (US)

(72) Inventors: Julien Frougier, Albany, NY (US); Karthik Yogendra, Albany, NY (US); Dimitri Houssameddine, Sunnyvale, CA (US); Kangguo Cheng, Schenectady, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 227 days.

(21) Appl. No.: 17/469,350

(22) Filed: Sep. 8, 2021

(65) Prior Publication Data

US 2023/0074676 A1 Mar. 9, 2023

(51) Int. Cl.
*G11C 11/16* (2006.01)
*H10B 61/00* (2023.01)
(Continued)

(52) U.S. Cl.
CPC ............ *G11C 11/161* (2013.01); *H10B 61/00* (2023.02); *H10N 50/01* (2023.02); *H10N 50/10* (2023.02); *H10N 50/80* (2023.02); *H10N 50/85* (2023.02)

(58) Field of Classification Search
CPC ... G11C 11/161; G11C 11/1673; H10B 61/00; H10N 50/01; H10N 50/10; H10N 50/80; H10N 50/85
See application file for complete search history.

(56) References Cited

U.S. PATENT DOCUMENTS 8,345,464 B2    1/2013  Kang
9,076,962 B2    7/2015  Hong
(Continued)

FOREIGN PATENT DOCUMENTS

JP        6512668 B2     5/2019
KR    20170048005 A     5/2017
WO     2015134206 A1    9/2015

OTHER PUBLICATIONS

Lumens, P.G.E., "An exploration of organic spin-valve structures", Report of a graduation project from Nov. 2006 to Jan. 2008, carried out at the Eindhoven University of Technology in the group Physics of Nanostructures (FNA), Jan. 2008, 98 pages.

*Primary Examiner* — Sultana Begum
(74) *Attorney, Agent, or Firm* — Monchai Chuaychoo

(57) ABSTRACT

An approach for minimizing stack height and reducing resistance of an MRAM (Magnetoresistive random-access memory) is disclosed. The approach leverages an MRAM device with a T shape magnetic bottom electrode. The T shape magnetic bottom electrode can be made from a lower resistance metal such as cobalt. Furthermore, the method of creating the MRAM can include, depositing a low-k dielectric layer, forming bottom electrode via within the low-k dielectric layer, depositing bottom electrode metal liner on the bottom electrode via, depositing bottom electrode magnetic metal on the bottom electrode metal liner, planarizing the bottom electrode magnetic metal, depositing coupling layer and an MRAM stack on the bottom electrode magnetic metal, patterning and etching anisotropically the MRAM stack and depositing in-situ conformal dielectric layer and forming a top contact via on the MRAM stack.

20 Claims, 11 Drawing Sheets

(51) Int. Cl.
    *H10N 50/01*     (2023.01)
    *H10N 50/10*     (2023.01)
    *H10N 50/80*     (2023.01)
    *H10N 50/85*     (2023.01)

(56) References Cited

U.S. PATENT DOCUMENTS

| | | |
|---|---|---|
| 9,373,782 B2 | 6/2016 | Li |
| 9,542,987 B2 | 1/2017 | Naik |
| 9,865,806 B2 | 1/2018 | Choi |
| 9,972,775 B2 | 5/2018 | Shum |
| 10,580,968 B1 | 3/2020 | Yi |
| 2006/0003470 A1* | 1/2006 | Chang .................. H10N 70/821 |
| | | 257/E45.002 |
| 2007/0187785 A1 | 8/2007 | Hung |
| 2013/0119494 A1 | 5/2013 | Li |
| 2015/0340596 A1* | 11/2015 | Huang .................. H10N 50/01 |
| | | 257/421 |
| 2019/0109281 A1 | 4/2019 | Doyle |
| 2020/0083428 A1* | 3/2020 | Weng .................. H01L 23/5226 |
| 2020/0251650 A1* | 8/2020 | Kim ...................... H10N 50/85 |
| 2020/0343448 A1* | 10/2020 | Ando .................... H10N 70/25 |

\* cited by examiner

COMPACT MRAM ARCHITECTURE WITH MAGNETIC BOTTOM ELECTRODE

BACKGROUND

The present invention relates generally semiconductor devices, and more particularly to MRAM (magnetoresistive random-access memory).

A MRAM is type of non-volatile RAM that stores data in the magnetic domains. Magnetic domain is an area within a magnetic material where the magnetization is in a uniform direction/alignment. A STT-MRAM (spin transfer torque) MRAM has been identified as a "universal" memory with potential markets extending from Flash replacement to SRAM replacement. This is due to the properties of STT-MRAM, which enables higher densities, low power consumption and reduced cost compared other MRAM devices. There are several challenges with integrating embedded STT-MRAM devices in MOL (middle-of-the-line) or BEOL (backend-of-the-line).

One challenge includes the bottom electrode (BE) and/or bottom via integration requirements for embedding into MRAM. Regarding the bottom electrode, the difficulty involves minimizing parasitic series resistance. The parasitic series resistance is important to optimize embedded MRAM performance. High parasitic series resistance can reduce the effective TMR (tunnel magnetoresistance) ratio and degrade the MRAM performances. One of the main contributors to the total resistance of a MRAM device is typically the metal bottom electrode. This bottom electrode is made from typically tungsten (W) and has smaller dimensions (i.e., critical dimension (CD) ~25-35 nm). The resistance of bottom electrode can be as high as the entire BEOL stack resistance (i.e., ~100-150Ω). Similarly, the bottom metal via, tungsten is the metal commonly used, contributes to the parasitic series resistance mentioned as a difficulty along with the bottom electrode.

Another challenge involves the MRAM structure height (thickness) for embedded integration with the logic devices. Typically during co-integration of STT-MRAM with another logic devices, it requires increasing the thickness of inter-layer dielectric to buffer the thickness of BE (bottom electrode) plus the MRAM structure. Thus, the inter-level logic via height has to increase to accommodate the BE plus MRAM insertion (which may require re-developing the logic via integration).

Another challenge involves logic integration with respect to an MTJ (magnetic-tunnel-junction) stack on top of a bottom electrode via (i.e., direct depositing). This challenge involves with two major issues.

The first issue is related to defects and the second issue is the magnetic design. The defects are related to incoming surface. For example, if the incoming surface is not perfectly flat, the quality of the MTJ stack can be compromised. Any step between the metal via and the ILD (inter layer dielectric) will cause roughness that could propagate to the tunnel barrier and cause defects (reliability concern).

The second issue relates to the magnetic design. It might be difficult to offset the stray field of the magnetic via by the reference layer if they have very different lateral dimensions.

In view of the foregoing challenges, there is a need to minimize BE resistance, reduce the total BE and MRAM height and solve the integration challenges.

SUMMARY

Aspects of the present invention disclose a device, method and computer program product for reducing resistance in an MRAM (Magnetoresistive random-access memory) device. The device may include, a top electrode coupled to an MRAM stack; a T-shape magnetic bottom electrode is disposed between the MRAM stack and a bottom contact.

The method may include, forming a magnetic stack on the T-shape bottom electrode; and forming a top electrode on the magnetic stack.

According to a yet further embodiment of the present invention, there is provided a computer program product being tangibly stored on a non-transient machine-readable medium and comprising machine-executable instructions. The instructions, when executed on a device, cause the device to perform acts of the method according to the embodiment of the present invention.

BRIEF DESCRIPTION OF THE DRAWINGS

Preferred embodiments of the present invention will now be described, by way of example only, with reference to the following drawings, in which.

DETAILED DESCRIPTION

Figure 1A:
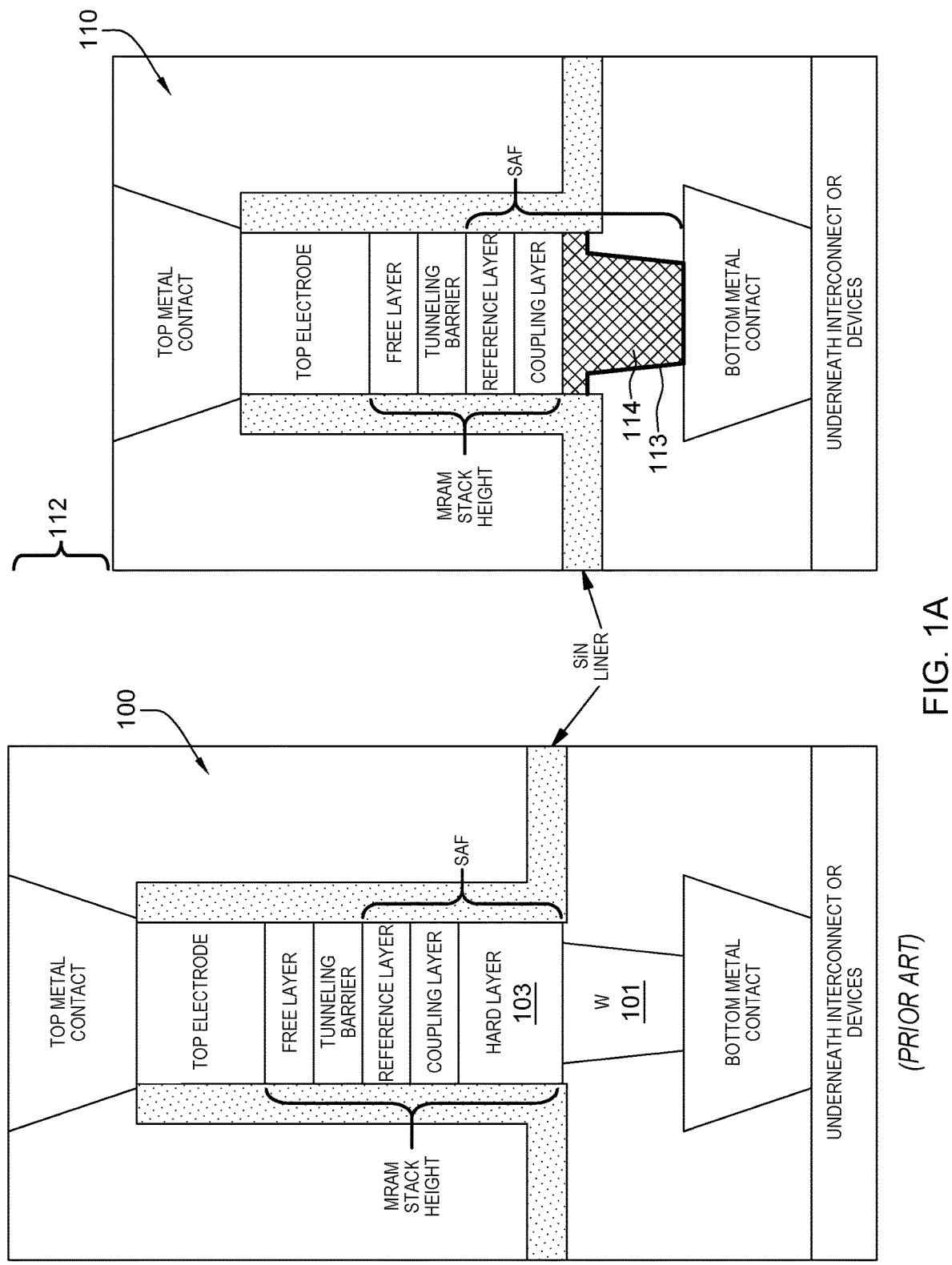
FIG. 1A is a depiction, a cross sectional view, of the current state of technology (prior art) related MRAM, designated as 100, side-by-side with an embodiment of the present invention, designated as 110.

According to one or more embodiments of the present invention, there are challenges relating to (i) reducing BE (bottom electrode) resistance (i.e., parasitic series resistance) that may occur in MRAM devices and (ii) reducing total height of a BE +MRAM (magnetoresistive random-access memory) stack height. The first challenge can be addressed by the introduction of a bottom electrode (i.e., 101 of FIG. 1A) made from a metal such as cobalt (Co), wherein Co has a lower resistance metal than W (tungsten) (i.e., tungsten is a commonly used in MRAM devices). Additionally, the bottom metal via can also be made from the same material (e.g., cobalt, etc.) as the bottom electrode to help reduce resistance. The second challenge of reducing the total height benefits or is ideal for co-integration with logic devices. For example, there is not a need to increase an inter-level via height in the logic region (i.e., see height difference 112 of FIG. 1A). The second challenge can be addressed by eliminating a hard layer (i.e., 103 of FIG. 1A) due to the unique characteristic and properties of a bottom electrode made from cobalt.

According to some embodiments of the present invention, problems relating integration challenges (e.g., defects and magnetic design, etc.) that may occur in MRAM devices can be addressed by an introduction of an under-polished magnetic via in the MRAM array. This will help guarantee low roughness and better stray field (magnetic) compensation.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments, whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

It should be understood that the Figures are merely schematic and are not drawn to scale. It should also be understood that the same reference numerals are used throughout the Figures to indicate the same or similar parts.

The present invention will now be described in detail with reference to the Figures.

FIG. 1A is a depiction of the current state of technology (i.e., prior art) related MRAM side-by-side with an embodiment of the present invention. It is noted that this is a side profile view (i.e., cross-section view along the X-axis).

The typical MRAM device (i.e., prior art), designated as 100, is depicted next to an embodiment of the present invention, designated as compact MRAM 110. MRAM stack 100 is typically made up of the following layers (from top to bottom): (i) top contact metal contact/via, (ii) top electrode, (iii) free layer, (iv) tunneling barrier, (v) reference layer, (vi) coupling layer, (vii) hard layer 103, (viii) bottom electrode 101 (i.e., tungsten material), (ix) bottom contact and (x) underneath interconnect or devices.

Compact MRAM 110 (i.e., one embodiment of the present invention) has similar structures to the prior art except for the following difference(s), such as the hard layer has been replaced with a T-shaped magnetic bottom electrode 114 and an optional inclusion of a metal liner (i.e., 113 of FIGS. 1A and 2), where the metal liner envelopes the bottom surface of the T-shaped magnetic bottom electrode 114. The structural difference and other unique structures of the present embodiment will be explained in greater details in the section, called "STRUCTURAL FEATURES". An advantage, previously mentioned, of compact MRAM 110 is the reduction in the overall height (i.e., height difference 112 of FIG. 1A) since the hard layer (103) has been "replaced" with T-shaped magnetic bottom electrode 114. This means that there is no need to increase the inter-level via height in the logic region.

Figure 1B:
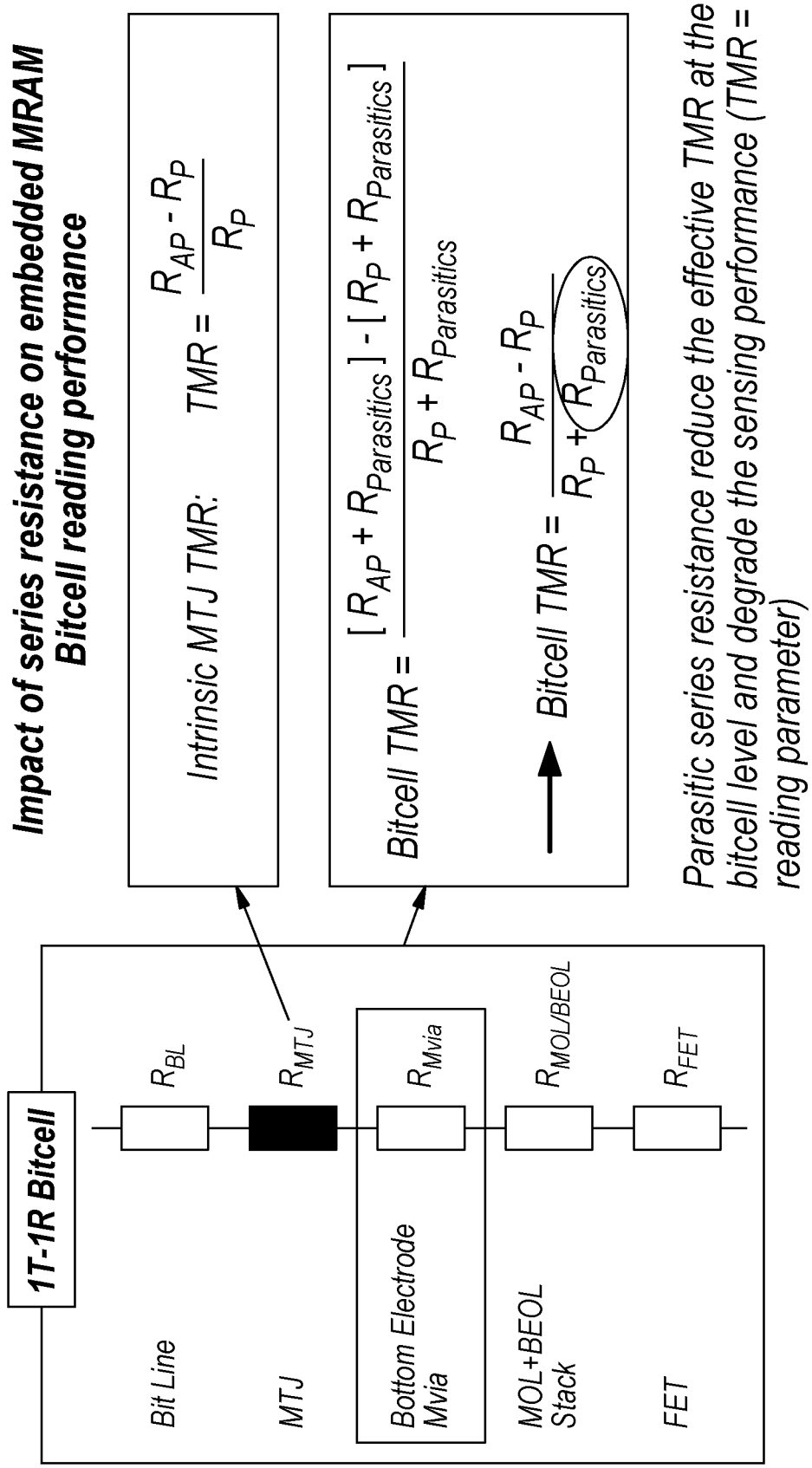
FIG. 1B illustrates the impact of resistance associated with embedded MRAM bitcell reading performance, in accordance with an embodiment of the present invention.

FIG. 1B illustrates the impact of series resistance associated with an embedded MRAM bitcell reading performance. For a standard connected MRAM cell stack, the TMR (tunnel magnetoresistance) ratio can be calculated as the AP state resistance minus the parallel state resistance, divided by the parallel state resistance plus any circuit parasitic series resistances. Parasitic series resistances arise from the circuit elements disposed between the MRAM cell stack and the associated access transistor. The resistance increases with the distance between the MRAM cell stack and the transistor due to increasing amount of material through which the write currents must pass.

The formula (see FIG. 1B) represented for the resistance of MTJ (magnetic-tunnel-junction) TMR is $$TMR = \frac{R_{AP} - R_P}{R_P},$$

where TMR is the tunnel magnetoresistance, $R_{AP}$ is the resistance related to anti-parallel and $R_P$ is the resistance related to parallel. The formula represented for Bitcell TMR is $$Bitcell\ TMR = \frac{R_{AP} - R_P}{R_P + R_{Parasitics}},$$

where $R_{Parasitics}$ is the resistance related to parasitic, $R_{AP}$ is the resistance related to anti-parallel and $R_P$ is the resistance related to parallel.

Parasitic resistance often reduces the effective TMR ratio at the bitcell level and degrades the sensing performance. Therefore, another advantage of compact MRAM 100 is utilizing a low resistance metal (such as cobalt) for (i) T-shaped magnetic bottom electrode 114 and/or (ii) bottom metal contact/via which would allow for a reduction parasitic series resistance.

Figure 1C:
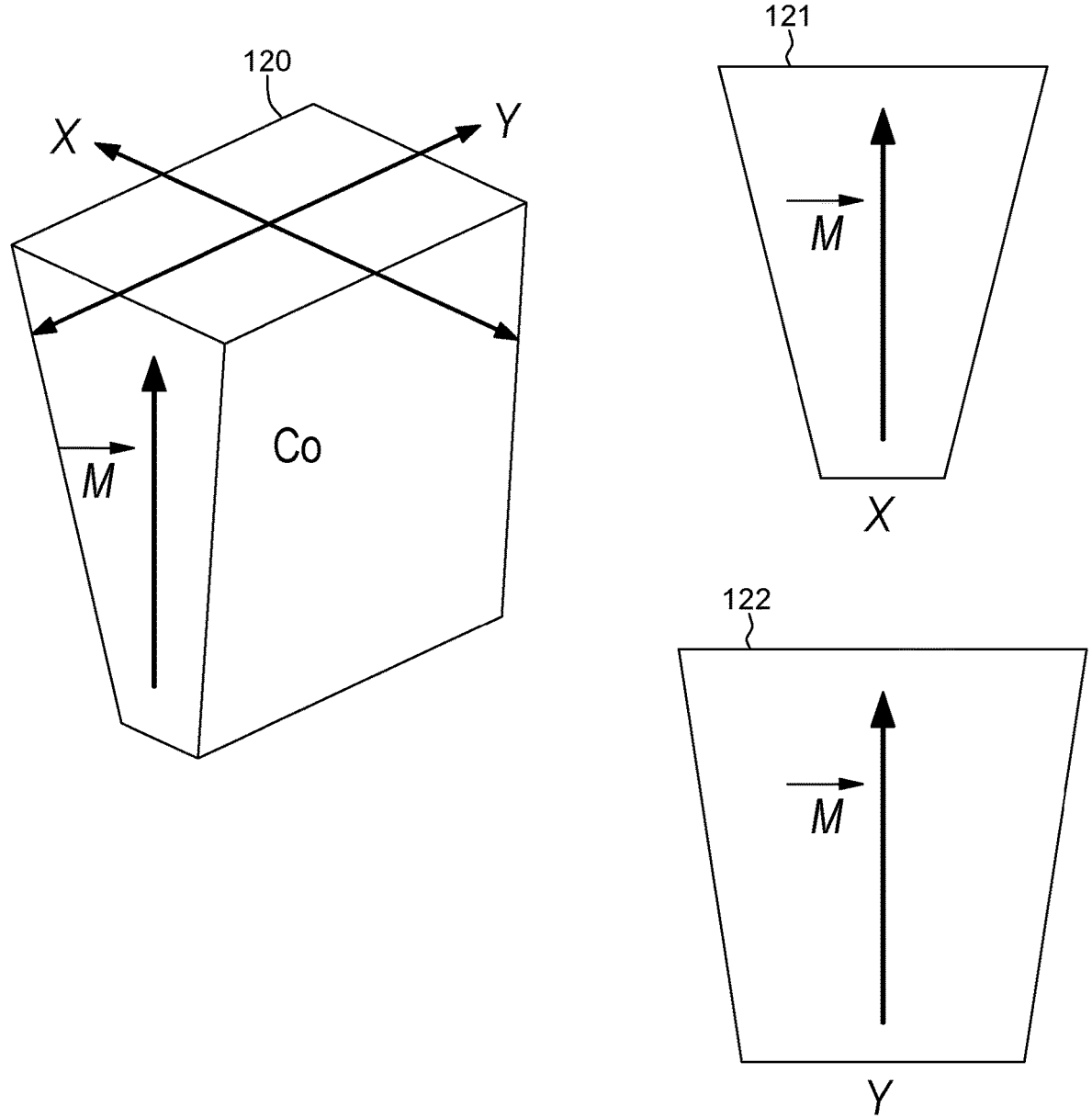
FIG. 1C illustrates the magnetization orientation associated with via interconnect, in accordance with an embodiment of the present invention.

FIG. 1C illustrates the magnetization orientation associated with via interconnect. In bulk magnetic systems, the dominant shape anisotropy fixes the orientation of the magnetization. However, utilizing "classic" via interconnect filled with cobalt metal, the orientation would be considered out-of-plane magnetization (see 120, 121 and 122). The orientation minimizes the magnetic energy of the system (i.e., bulk magnetic).

Figure 1D:
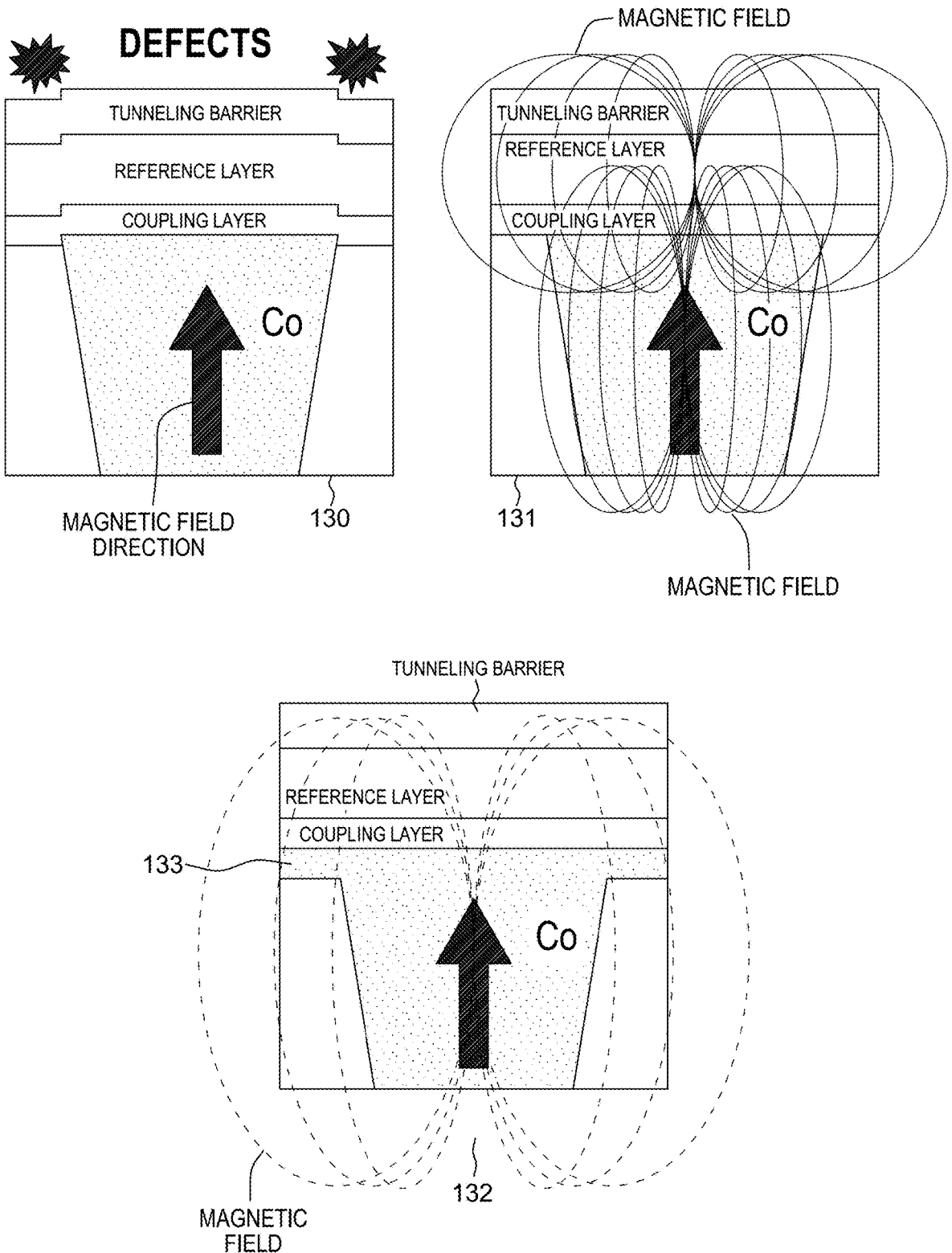
FIG. 1D illustrates challenges with integration and a solution to the challenge, in accordance with an embodiment of the present invention.

FIG. 1D illustrates challenges with integration and a solution to the challenge, in accordance with an embodiment of the present invention. For example, directing deposition of an MTJ stack on top of a via can be challenging with two major issues. The first issue is related to defects (refer to 130) and the second issue relates to the magnetic design (see 131 and 132). Regarding the first issue, for example, if the incoming surface (after back-sputter from MTJ tool) is not perfectly flat, then the quality of the MTJ stack can be compromised. Any step between the metal via and the ILD (inter-level dielectric) will cause roughness that could propagate to the tunnel barrier and cause defects (i.e., a reliability concern).

The second issue relates to the magnetic design (see 131 and 132). It might be difficult to offset the stray field (i.e., 133) of the magnetic via by the reference layer if they have very different lateral dimensions. The solution to both issues is utilizing an under-polished magnetic contact in the MRAM array. This will help guarantee low roughness and better stray field (magnetic) compensation.

Structural Features

Figure 2:
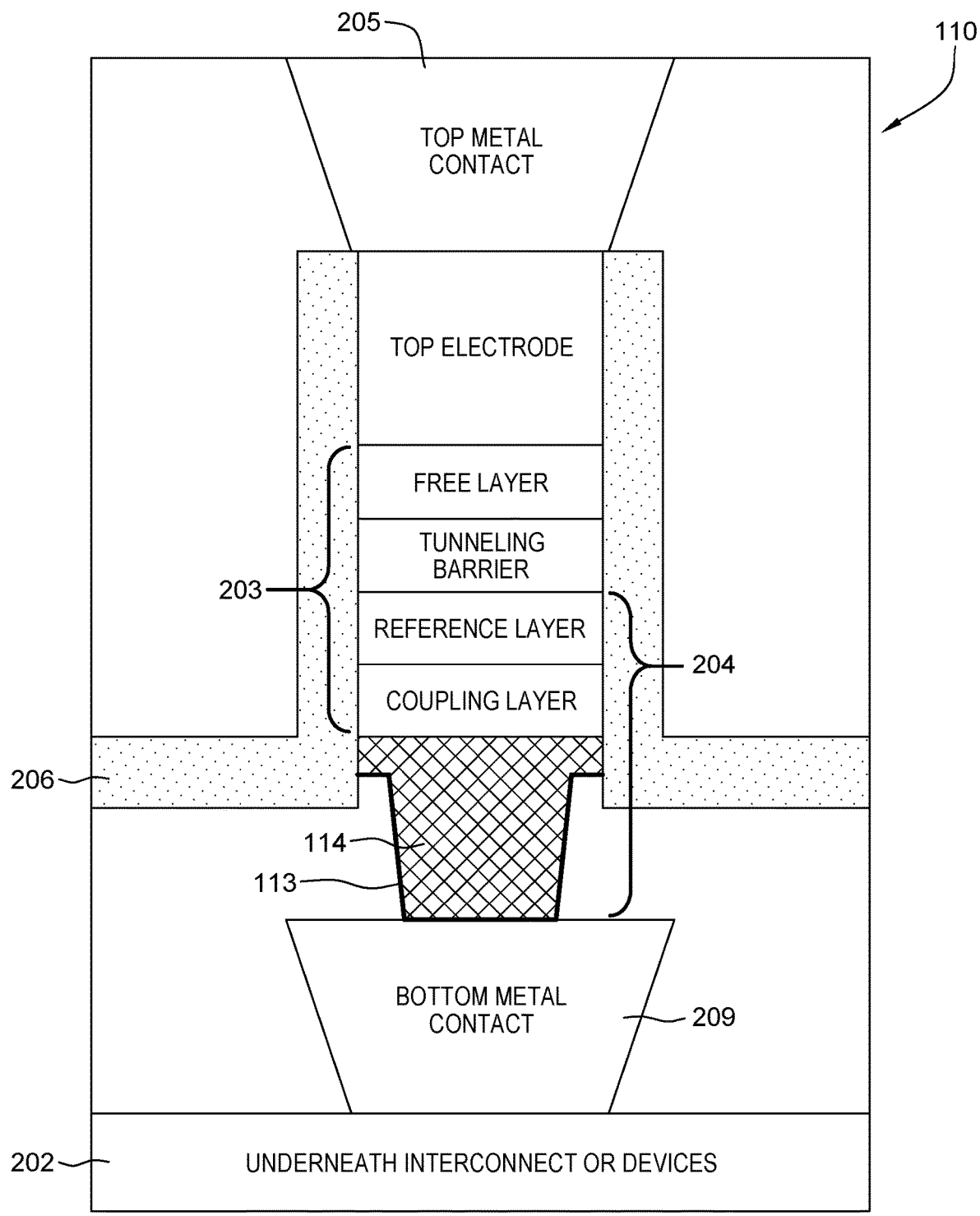
FIG. 2 is a detailed view, a cross sectional view, of compact MRAM 110, in accordance with an embodiment of the present invention.

FIG. 2 is a detailed view of compact MRAM 110, in accordance with an embodiment of the present invention. It is noted that this is a side profile view (i.e., cross-section view along the X-axis).

Compact MRAM 110 includes the following layers/structure, which will be described from top to bottom (referring to FIG. 2): (1) top metal contact 205; (2) top electrode; (3) free layer; (4) tunneling barrier; (5) reference layer; (6) coupling layer; (7) T-shaped magnetic bottom electrode (i.e., 114); (8) metal liner 113, (9) bottom contact 209 and (10) bottom interconnect/devices (i.e., 202). The MRAM stack is designated as 203 and the SAF (synthetic anti-ferromagnetic) layer is designated as 204. As shown, MRAM stack 203 is made up of the free layer (FL), tunneling barrier (or barrier), reference layer (RL) and the coupling layer. As shown, SAF layer 204 is made up of the reference layer, coupling layer, T-shaped magnetic bottom electrode 114 and optional metal liner 113. An anti-ferromagnetic material is a material that exhibits antiferromagnetism, i.e., its magnetic moments in one area align in a regular pattern with neighboring spins pointing in opposite directions. In this invention, the SAF layer 204 comprises the reference layer, coupling layer, the magnetic bottom electrode, and the optional metal liner 113. The interaction between those layers effective results in an anti-ferromagnetic layer, referred to as synthetic antiferromagnets (SAF). Furthermore, a layer of dielectric materials encapsulates the MRAM structure (i.e., layer 206). layer of dielectric materials can include, but are not limited to, a carbon dope oxide dielectric (SiCOH), nitrogen doped silicon carbide (Nblok), silicon oxide, carbon doped silicon oxide, fluorine doped silicon oxide, or any suitable combination of those materials.

In regards T-shaped magnetic bottom electrode 114, it can be made from metal such as cobalt (Co). As previously mentioned, the advantage(s) of using Co includes: (i) it is a magnetic material and exhibit a fringing magnetic field that can be harnessed to help with the reducing the overall stack height, and (ii) Co has a low resistance and will help with reducing parasitic series resistance. Another unique feature of T-shaped magnetic bottom electrode 114 is the top portion of the "T". The top portion of the T-shaped metal can be formed by an under-polishing process described in detail later. By having an under-polished magnetic metal contact in the MRAM array, it helps with low roughness and better stray magnetic field compensation (refer to magnetic field orientation from FIGS. 1C and 1D). It is noted that the MRAM stack (e.g., coupling layer, reference layer, tunneling barrier, free layer, etc.) directly contacts T-shaped magnetic bottom electrode 114. Another unique feature of the top surface of the "T" is that it exhibits a substantially flat surface. This means that it has low degree of roughness. For example, the roughness is less than 2 nm.

In some embodiments, the thickness of T-shaped magnetic bottom electrode 114 can be in the range of 20 nm to 50 nm. In other embodiments, the thickness can fall outside that range, depending on the application.

Process Features

Figure 3:
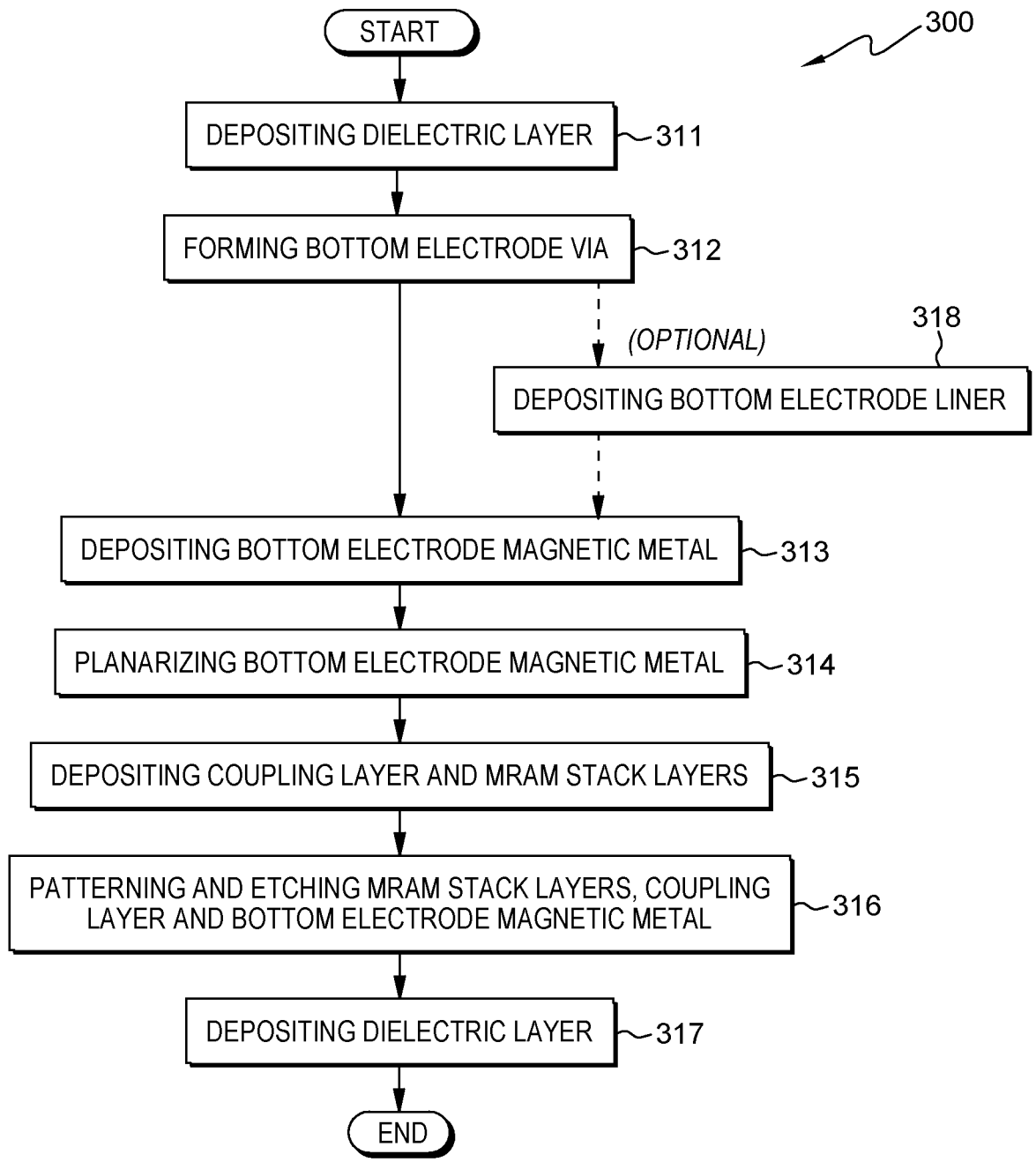
FIG. 3 is a high-level flowchart illustrating one process of forming the compact MRAM 110, designated as process 300, in accordance with one embodiment of the present invention.

In one embodiment of the present invention, the steps in manufacturing compact MRAM 110 can be summarized at a high level as process 300 (see FIG. 3).

Process 300 begins with depositing a dielectric layer (e.g., Nblok, SiCOH, etc.) onto a substrate at step 311. Preferably, the dielectric layer comprises a low-k dielectric material. The term "low-k" as used throughout the present application denotes a dielectric material that has a dielectric constant of less than silicon dioxide. It is noted that the deposition method can include, but it is not limited to, chemical vapor deposition (CVD), plasma enhanced chemical vapor deposition (PECVD), evaporation or spin-on coating.

Process 300 continues with forming bottom electrode via/contact (i.e., 209) within the low-k dielectric layer (step 312). In some embodiments, there is an optional step (as step 318) to proceed with depositing a metal liner (i.e., 113) or step 318 can be skipped entirely.

Process 300 continues as step 313 with depositing bottom electrode magnetic metal (i.e., 114.) Bottom electrode magnetic metal (i.e., 114) may be deposited by processes, which include, e.g., chemical vapor deposition (CVD), physical vapor deposition (PVD), sputtering, atomic layer deposition (ALD), or gas cluster ion beam (GCIB) deposition.

Process 300 continues as step 314 with partially planarizing the bottom electrode magnetic metal (i.e., 114). It is noted that the planarization method can included, but it is not limited to, chemical mechanical planarization (CMP). Process 300 continues with depositing coupling layer and MRAM stack 203 (step 315).

Process 300 continues with patterning MRAM stack and etching (anisotropically) MRAM stack 203, coupling layer and bottom electrode magnetic metal 114 (step 316). It is noted that patterning methodology can include, but it is not limited to, an ion beam etching (or milling) (IBE). Anisotropic etching methodology can include, but it is not limited to, reactive ion etching (RIE). The etching process may be performed as a single step or a series of multiple steps. Step 317 continues with forming a dielectric layer or multiple layers of dielectric materials to encapsulate MRAM stack. Process 300 continues with forming a top metal contact via 205 as the final step.

Figure 4:
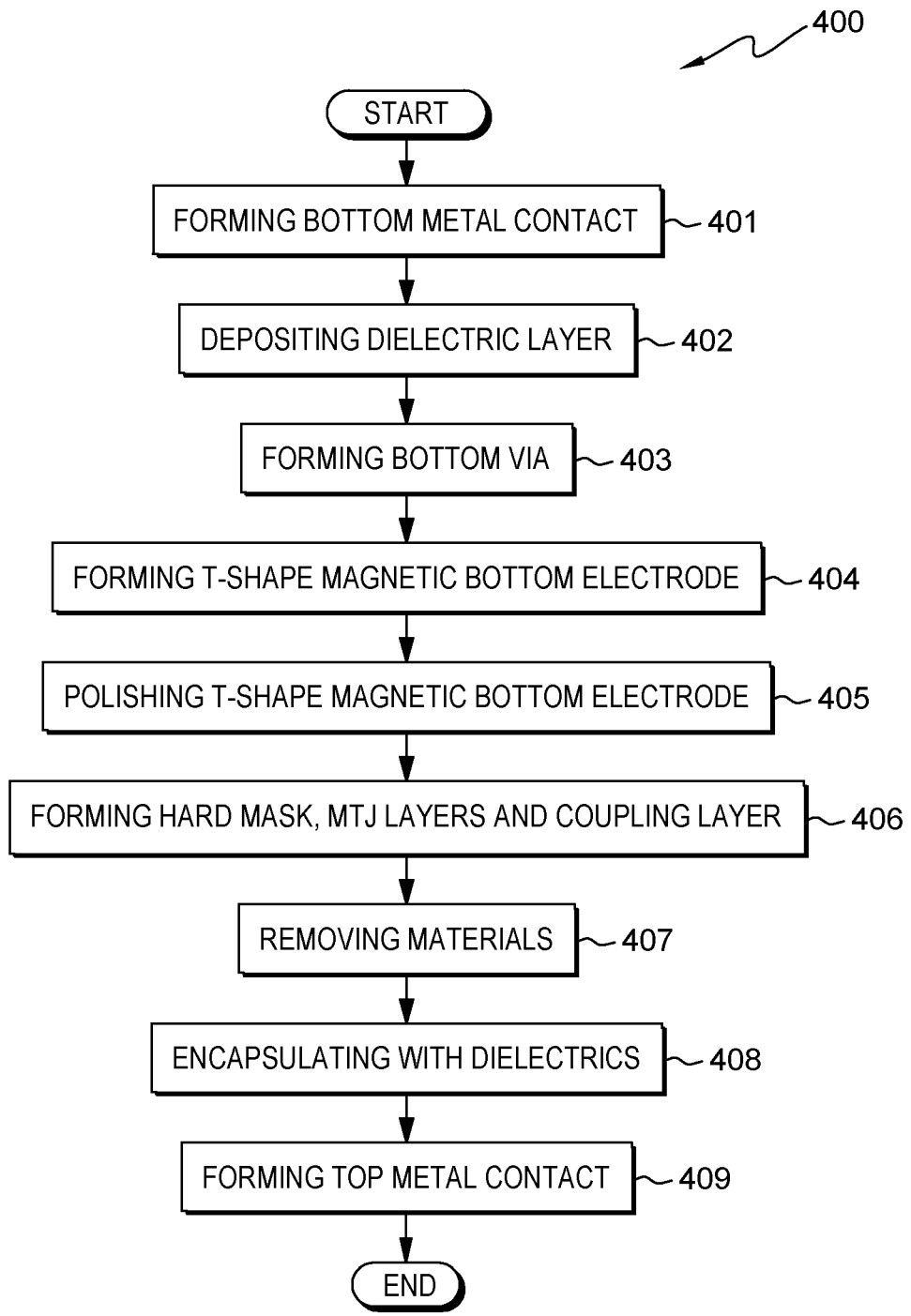
FIG. 4 is a high-level flowchart illustrating another process of forming the compact MRAM 110, designated as process 400, in accordance with another embodiment of the present invention.

According to an alternative embodiment, another flowchart for creating compact MRAM 110 is provided and designated as process 400 (see FIG. 4). It can be helpful to follow the steps by referring to FIGS. 5A-5I.

At the beginning of the process (i.e., process 400), for example, a base structure substrate is provided. For example, silicon substrate or any other suitable substrates is provided (i.e., 500 of FIG. 5A). Although it is not shown, the substrate can comprise other devices and structures such as transistors, diodes, capacitors, resistors, isolations, contacts, wires, etc. In step 401, (referring to FIG. 5A) a bottom metal contact (501) is formed over the substrate. The bottom metal contact 501 can be formed by any suitable process. In some embodiments, the bottom metal contact 501 is formed by depositing a dielectric (e.g., SiOCH), patterning the dielectric to form a trench, depositing a conductive material or multiple conductive materials in the trench, and polishing the conductive material(s). In other embodiments, the bottom contact is formed by depositing a conductive material, patterning the conductive material to a desired shape (e.g., a conductive line), and forming a dielectric around the conductive material, for example, by deposition and planarization. The bottom metal contact 501 can be made of any suitable conductive materials, including but not limited to, tungsten, copper, ruthenium, aluminum, etc.

Figure 5A:
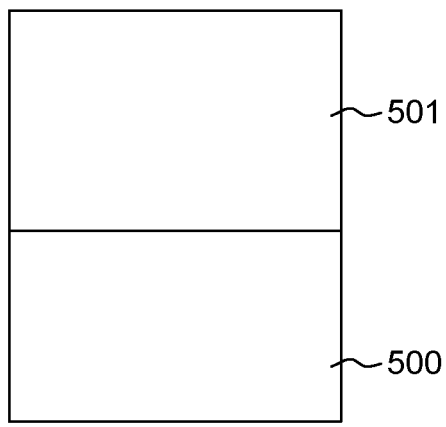
FIGS. 5A-5I illustrates a manufacturing view, cross sectional view, of forming the compact MRAM 110 of FIG. 2, in accordance with an embodiment of the present invention.
Figure 5B:
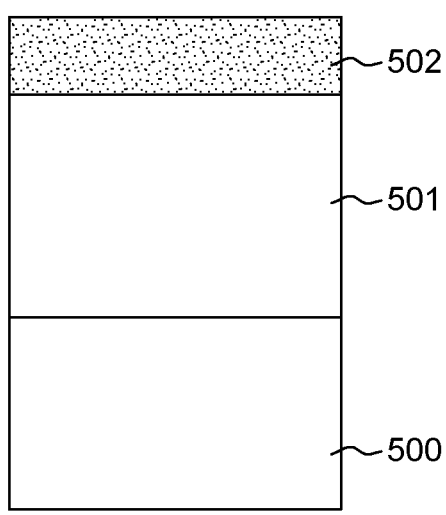

Step 402 involves depositing another dielectric layer (i.e., 502) over the base structure (see FIG. 5B). The dielectric material can be any suitable dielectric material, including but not limited to, Nblok, SiCOH, silicon oxide, fluorine doped silicon oxide, silicon nitride, etc. The dielectric material can be formed by any suitable deposition techniques, including but not limited to, chemical vapor deposition (CVD), physical vapor deposition (PVD), atomic layer deposition (ALD), or gas cluster ion beam (GCIB) deposition.

Figure 5C:
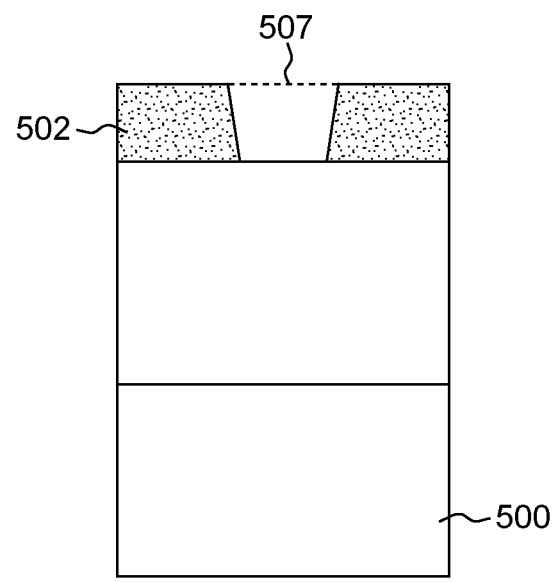

Step 403 involves forming a bottom via 507 (see FIG. 5C). The via can be formed by any suitable semiconductor processing, for example, lithography followed by etching.

Step 404 involves depositing a magnetic material (i.e., 114) into the bottom via from the prior step. However, there is an optional step of depositing a metal liner 113 (see FIG. 5D). The metal liner (i.e., 113) can include but is not limited to, titanium nitride (TiN), tantalum nitride (TaN), hafnium nitride (HfN), niobium nitride (NbN), tungsten nitride (WN), tungsten carbon nitride (WCN), or combinations thereof. In various embodiments, the barrier layer (i.e., metal liner 113) can be deposited in the via by ALD, CVD, physical vapor deposition (PVD), or combinations thereof.

The magnetic metal (i.e., 114) can be, but it is not limited to cobalt, iron and nickel. However, the preferred metal is cobalt. Any deposition technique can be used to form the bottom electrode, for example, PVD, sputtering, or CVD.

After deposition of the magnetic material 114, its surface may not be flat. Step 405 involves planarizing the magnetic metal from the prior step (see FIG. 5E). Planarizing the magnetic metal can include utilizing polishing technique such as CMP (chemical mechanical polishing). It is noted that that polishing process involves underpolishing. "Underpolishing" means that the polish process remove a certain amount of magnetic material above the dielectric layer 502 while a portion of the magnetic material (i.e., 114) remains above the top surface of the dielectric layer 502. After polishing, the top surface of the T-shape magnetic bottom electrode 114 is substantially flat, i.e., a low degree of roughness. For example, the surface roughness of the top surface of magnetic material (i.e., 114) is less than 2 nm after polishing. The remaining magnetic material above the dielectric layer 502 can range, for example, from 5 nanometers to 20 nanometers. The total thickness of the magnetic material (i.e., 114), including the portion above the dielectric layer 502 and within the via inside the dielectric layer 502, ranges, for example, from 20 nanometers to 50 nanometers. Thicknesses specified herein is exemplary and is not meant to be limiting.

Figure 5D:
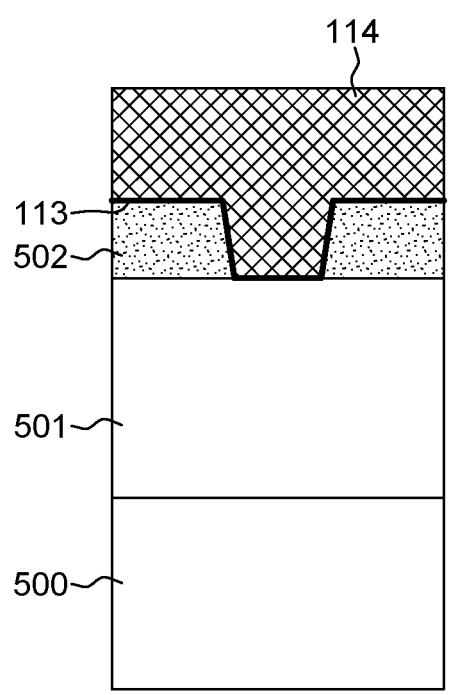
Figure 5E:
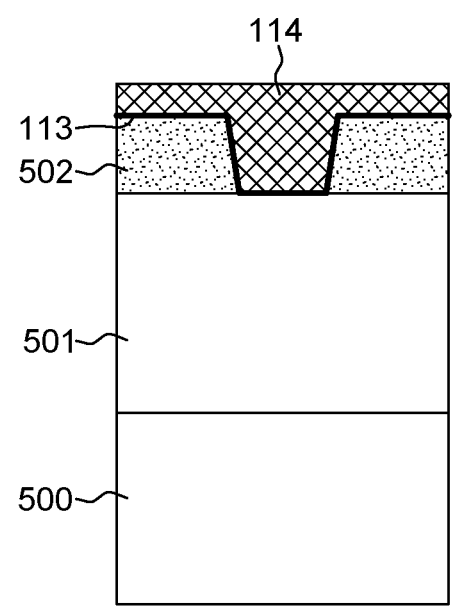
Figure 5F:
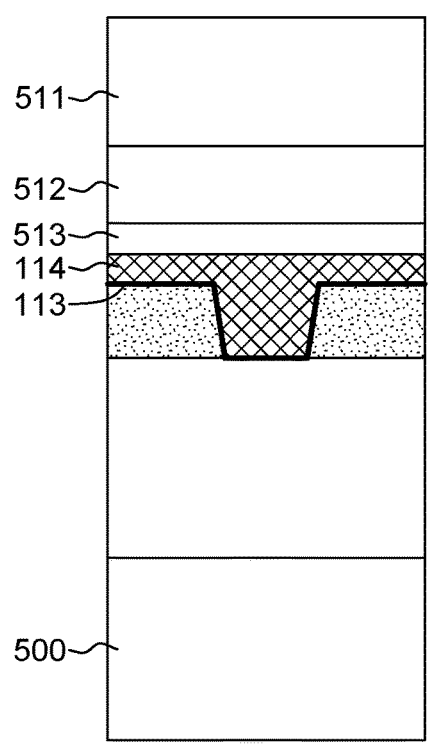

Step 406 involves depositing a coupling layer and a MTJ layer (see FIG. 5F). A MTJ layer can comprise of a free layer and a fixed layer (or sometimes referred as "pinned layer" or "reference layer"). Each free layer and fixed layer includes a magnetic material. The free and reference layers are separated by a tunnel barrier layer. The free layer and the reference layer are magnetically de-coupled by the tunnel barrier. The free layer has a variable magnetization direction, and the reference layer has an invariable magnetization direction. A wide variety of layers and elements (e.g., an MTJ cap, multiple free/reference layers, etc.) can be included in an MTJ stack. The free layer may comprise CoFeB or any other suitable materials. The fixed layer may comprise NiFe, Co/NiFe/Co, or any other suitable materials. Each layer may comprise a single or multiple laminated layers. The tunnel barrier layer may comprise of aluminum oxide (AlO) aluminum titanium oxide (AlTiO), or magnesium oxide (MgO). A deposition of hardmask layer 511 is formed on top of the MTJ layer 512. For example, a hard mask layer can be titanium nitride.

Step 407 involves patterning and etching the hardmask layer 511, the MTJ layer 512, and the T-shaped magnetic bottom electrode 114 to form a pillar 550 by removing unwanted materials (see 550 of FIG. 5G) Step 407 can involve multiple process steps, such as lithography, etching, cleaning, etc. The etching process can be a single-step or multiple-step process. The etching process can involve reactive ion etch (RIE), ion beam etching (IBE), or a combination of both.

Figure 5G:
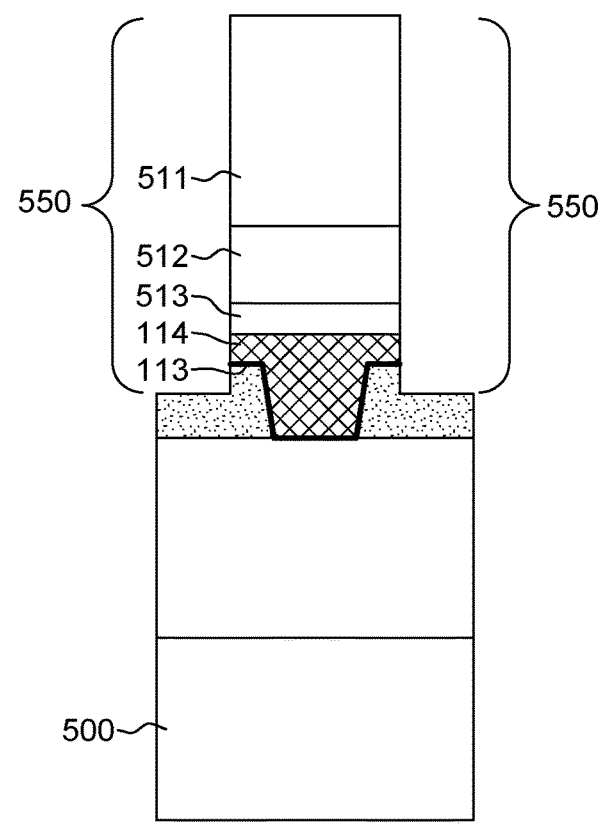
Figure 5I:
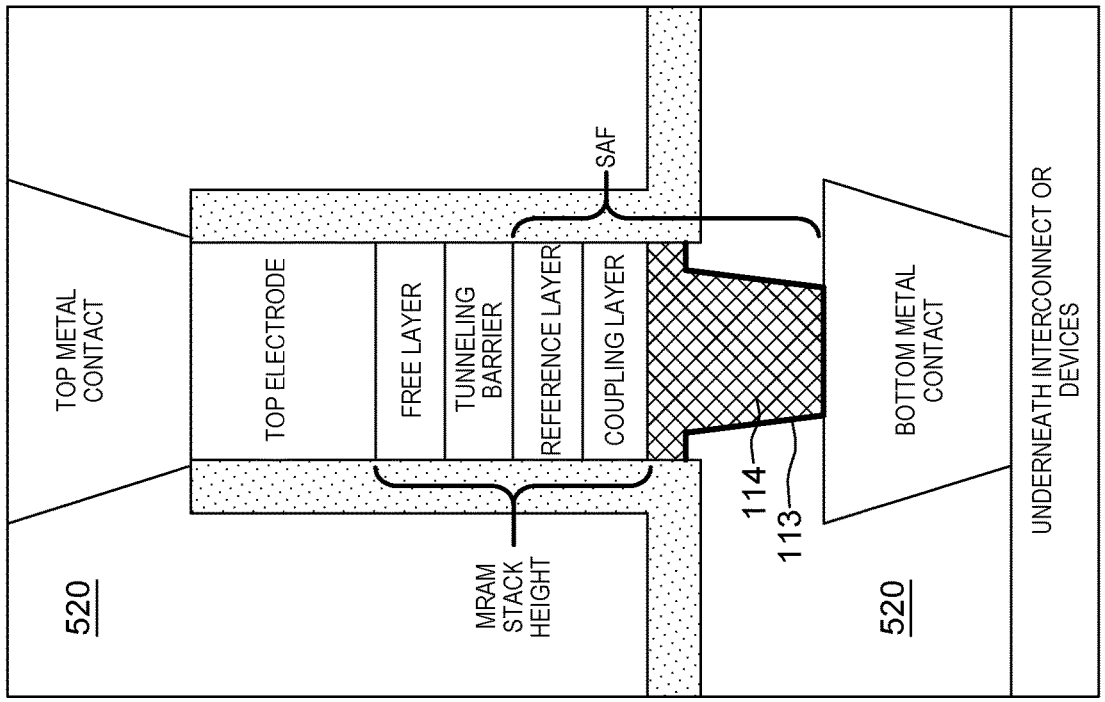
Figure 5H:
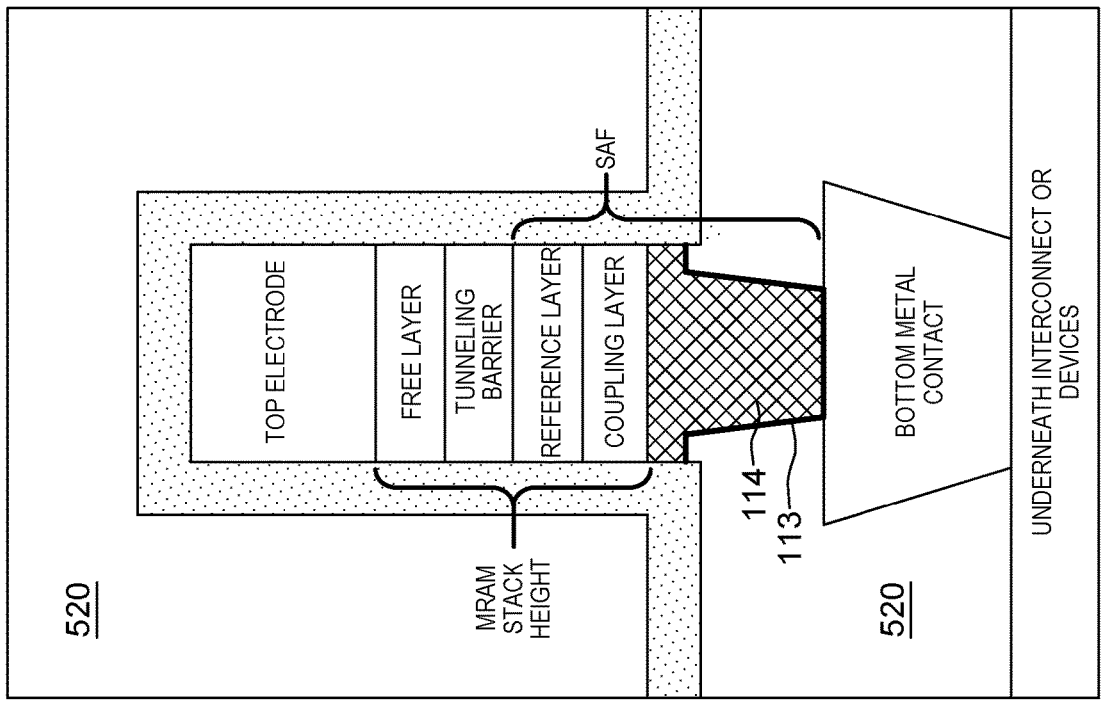

Step 408 involves encapsulating the MRAM stack with a dielectric material (i.e., 520) or multiple materials (see FIG. 5H). The dielectric material can be any suitable material, including but not limited to, silicon oxide, SiOCH, silicon nitride, etc. In some embodiments, the MRAM stack is first encapsulated with a silicon nitride (SiN) followed by SiOCH. The encapsulation dielectric can be deposited by any suitable deposition techniques, including but not limited to, CVD, spin-on, ALD, etc. in some embodiment, the hardmask is made of a conductive material (e.g., TiN). After patterning the remaining hardmask can remain to serve as the top electrode which is self-aligned to the underlying MTJ stack.

The final step of process 400 includes the formation of top metal contact (step 409) (see FIG. 5I). This step may include the use of deposition, patterning, etching, metallization and CMP to form the top metal contact (i.e., via).

FIGS. 5A-5I illustrates a manufacturing process view in creating compact MRAM 110, in accordance with an embodiment of the present invention.

In FIG. 5A, the incoming structure depicts a substrate (500) containing bottom metal contact 501 (i.e., copper). In FIG. 5B, a deposition of a dielectric layer 502 commences. Subsequently, the bottom electrode via patterning is performed in FIG. 5C. In FIG. 5D, in one embodiment, an optional step of depositing a metal layer/liner (i.e., 113) can be utilized, depending on the application. Otherwise, a layer of magnetic material (i.e., 114) is deposited over dielectric layer 502. The magnetic material can be, for example, cobalt. In FIG. 5E, the magnetic material undergoes an underpolish process, resulting in a T-shape bottom electrode. In FIG. 5F, a deposition of a coupling layer 513, a MTJ layer 512, and a hardmask layer 511, occurs. In FIG. 5G, the hardmask layer 511, the MTJ layer 512, the coupling layer 513, and the T-shaped magnetic bottom electrode 114 are patterned In FIG. 5H, one or multiple dielectric materials is deposited to encapsulate the MRAM stack. Lastly, in FIG. 5I, the top contact via is formed.

What is claimed is:

1. A compact MRAM (magnetoresistive random-access memory) device with a reduced parasitic resistance capability, the compact MRAM device comprising:
   a top electrode coupled on top of a magnetic stack, wherein the magnetic stack further comprises of a free layer, a tunneling barrier, a reference layer, and a coupling layer, in that specific order from top to bottom;

a t-shape magnetic bottom electrode is disposed below and coupled to the coupling layer;

the t-shape magnetic bottom electrode comprising of a horizontal layer being supported by a vertical layer;

a top surface of the horizontal layer of the T-shape magnetic bottom electrode is in direct contact with a bottom surface of the coupling layer and a bottom surface of the vertical layer of T-shape magnetic bottom electrode is in direct contact with a bottom contact, wherein the top surface of the horizontal layer has been under-polished to a low roughness which further reduces stray magnetic field compensation;

a first liner surrounding the top electrode and the magnetic stack;

a first dielectric layer surrounding the first liner;

a metal liner disposed on the t-shape magnetic bottom electrode;

the metal liner envelops the bottom surface of the vertical layer and a bottom surface of the horizontal layer of the T-shape magnetic bottom electrode; and a second dielectric layer surrounding the metal liner and the bottom contact.

2. The semiconductor device of claim 1, wherein a top metal contact is coupled to the top electrode.

3. The semiconductor device of claim 2, wherein the low roughness is less than 2 nm.

4. The semiconductor device of claim 3, wherein a bottom interconnect is coupled to the bottom contact.

5. The semiconductor device of claim 1, wherein T-shape magnetic bottom electrode is a material made of cobalt.

6. The semiconductor device of claim 1, wherein the T-shape magnetic bottom electrode has a thickness level between 20 nm to 50 nm.

7. The semiconductor device of claim 1, wherein the semiconductor device is a magnetoresistive random access memory (MRAM).

8. The semiconductor device of claim 1, wherein the T-shape magnetic bottom electrode combined with coupling layer and the reference layer forms an anti-ferromagnetic structure.

9. The semiconductor device of claim 1, wherein the bottom contact further comprises, copper.

10. A method for forming a compact MRAM (magnetoresistive random-access memory) device with a reduced parasitic resistance capability, the method comprising:

forming a substrate;

forming a magnetic stack on the T-shape magnetic bottom electrode, wherein the magnetic stack further comprises of a free layer, a tunneling barrier, a reference layer, and a coupling layer;

forming a top electrode on the magnetic stack;

forming a first liner over the top electrode and the magnetic stack;

forming a first dielectric layer over the first liner;

forming a T-shape magnetic bottom electrode on the bottom contact, further comprising:

forming a horizontal layer over a vertical layer, wherein the horizontal layer contains a top surface and a bottom surface and the top surface has been under-polished to a roughness which further reduces stray magnetic field compensation; and disposing the t-shape magnetic bottom electrode to the coupling layer;

forming an outer metal liner; and forming a second dielectric layer over the outer metal liner.

11. The method of claim 10, wherein forming the T-shape bottom electrode further comprises:

forming a via in the first dielectric layer;

depositing a magnetic material on the via; and planarizing the magnetic material.

12. The method of claim 10, wherein the T-shape bottom electrode magnetic metal is cobalt.

13. The method of claim 11, further comprising:

depositing a bottom contact over the substrate.

14. The method of claim 10, wherein forming the magnetic stack on the T-shape bottom electrode further comprises:

depositing the magnetic stack; and patterning the magnetic stack.

15. The method of claim 11, wherein planarizing the magnetic material further comprises:

underpolishing the magnetic material to leave the magnetic material above and within the via.

16. The method of claim 10, wherein the dielectric layer is made from a low-k dielectric material.

17. A computer program product for creating a compact MRAM (magnetoresistive random-access memory) device with a reduced parasitic resistance capability, the computer program product comprising:

one or more computer readable storage media and program instructions stored on the one or more computer readable storage media, the program instructions comprising the steps of:

forming a substrate;

forming a magnetic stack on the T-shape magnetic bottom electrode, wherein the magnetic stack further comprises of a free layer, a tunneling barrier, a reference layer, and a coupling layer;

forming a top electrode on the magnetic stack;

forming a first liner over the top electrode and the magnetic stack;

forming a first dielectric layer over the first liner;

forming a T-shape magnetic bottom electrode on the bottom contact, further comprising:

forming a horizontal layer over a vertical layer, wherein the horizontal layer contains a top surface and a bottom surface and the top surface has been under-polished to a roughness which further reduces stray magnetic field compensation; and disposing the t-shape magnetic bottom electrode to the coupling layer;

forming an outer metal liner; and forming a second dielectric layer over the outer metal liner.

18. The computer program product of claim 17, wherein program instructions to form the T-shape bottom electrode comprises:

forming a via in the first dielectric layer;

depositing a magnetic material on the via; and planarizing the magnetic material.

19. The computer program product of claim 17, further comprising:

depositing a bottom contact over the substrate.

20. The computer program product of claim 17, wherein the T-shape bottom electrode magnetic metal is cobalt.

* * * * *